(12) United States Patent
Chaji et al.

(10) Patent No.: US 12,276,679 B2
(45) Date of Patent: Apr. 15, 2025

(54) COUPLING PROBE FOR MICRO DEVICE INSPECTION

(71) Applicant: VueReal Inc., Waterloo (CA)

(72) Inventors: Gholamreza Chaji, Waterloo (CA); Won Kyu Ha, Waterloo (CA)

(73) Assignee: VueReal Inc., Waterloo (CA)

( * ) Notice: Subject to any disclaimer, the term of this patent is extended or adjusted under 35 U.S.C. 154(b) by 291 days.

(21) Appl. No.: 17/910,600

(22) PCT Filed: Mar. 10, 2021

(86) PCT No.: PCT/CA2021/050318
§ 371 (c)(1),
(2) Date: Sep. 9, 2022

(87) PCT Pub. No.: WO2021/179077
PCT Pub. Date: Sep. 16, 2021

(65) Prior Publication Data
US 2023/0152349 A1    May 18, 2023

Related U.S. Application Data

(60) Provisional application No. 62/987,586, filed on Mar. 10, 2020.

(51) Int. Cl.
*G01R 1/073*   (2006.01)
*G01R 1/067*   (2006.01)
*G01R 31/265*  (2006.01)

(52) U.S. Cl.
CPC ..... *G01R 1/07314* (2013.01); *G01R 1/06794* (2013.01); *G01R 31/265* (2013.01)

(58) Field of Classification Search
CPC .. G01R 31/265; G01R 1/07314; G01R 1/067; G01R 1/06716; G01R 1/06733; G01R 1/06755; G01R 1/06794; G01R 1/073; G01R 31/2635; G01R 1/07357; G01R 31/2621; G01R 31/2628; G01R 31/2648; G01R 31/2851; H01L 22/14; H01L 22/12; H01L 2224/16225
See application file for complete search history.

(56) References Cited

U.S. PATENT DOCUMENTS

| | | | |
|---|---|---|---|
| 5,677,634 A | 10/1997 | Cooke et al. | |
| 2004/0164752 A1 | 8/2004 | Crook et al. | |
| 2006/0217906 A1* | 9/2006 | Barbara | G01R 1/36 702/60 |
| 2008/0265933 A1* | 10/2008 | Tanioka | G01R 31/3025 324/756.04 |
| 2016/0217720 A1 | 7/2016 | Chaji | |

OTHER PUBLICATIONS

WIPO: PCT International Search Report and Written Opinion relating to PCT application No. PCT/CA2021/050318, dated Jun. 5, 2021.

* cited by examiner

*Primary Examiner* — Son T Le

(57) ABSTRACT

The present disclosure describes a probe design to measure cycles of microdevices. In particular, the probe comprises, electrodes, dielectric, stimulating capacitor, voltage stimulating source for time varying stimulating voltage signal and a series switch to control biasing condition. The probe structure further has a probe tip and resting pads (ring shape or otherwise) along with a leveling mechanism and apparatus. The disclosure also describes a method to measure cycles of microdevices using the probe structure.

34 Claims, 3 Drawing Sheets

COUPLING PROBE FOR MICRO DEVICE INSPECTION

FIELD OF THE INVENTION

The present invention relates to probe design to measure cycles of microdevices.

BRIEF SUMMARY

An embodiment of this invention relates to a coupling probe to measure cycles of a microdevice comprising, an electrode made of a conductive layer covered by a dielectric to stimulate the microdevice, a stimulating capacitor that is formed by the conductive layer, the dielectric and a device pad, a voltage stimulating source to stimulate the stimulating capacitor; and a switch built in series to turn the micro device ON after a first active portion of a stimulating signal.

Another embodiment of this invention relates to a method to measure cycles of a microdevice using a contactless probe, the method comprising, applying a time varying stimulating voltage signal to a stimulating capacitor that is formed between at least one contact/pad of the micro device and a common electrode; activating a function in the microdevice due to one of a positive or a negative slope of the stimulating voltage signal, and using a switch to keep the micro device turned ON after an active portion of the time varying stimulating voltage signal.

Another embodiment of this invention relates to a method to measure cycles of a microdevice using a contactless probe, the method comprising, applying a time varying stimulating voltage signal to a stimulating capacitor that is formed between at least one contact/pad of the micro device and a common electrode, activating a function in the microdevice due to one of a positive or a negative slope of the stimulating voltage signal, and increasing an amplitude of the active part of time varying stimulating voltage signal after each cycle.

BRIEF DESCRIPTION OF THE DRAWINGS

The foregoing and other advantages of the disclosure will become apparent upon reading the following detailed description and upon reference to the drawings.

FIG. 2 shows a positive slope of $V_{ST}$ when the device is ON.

Figure 1A:
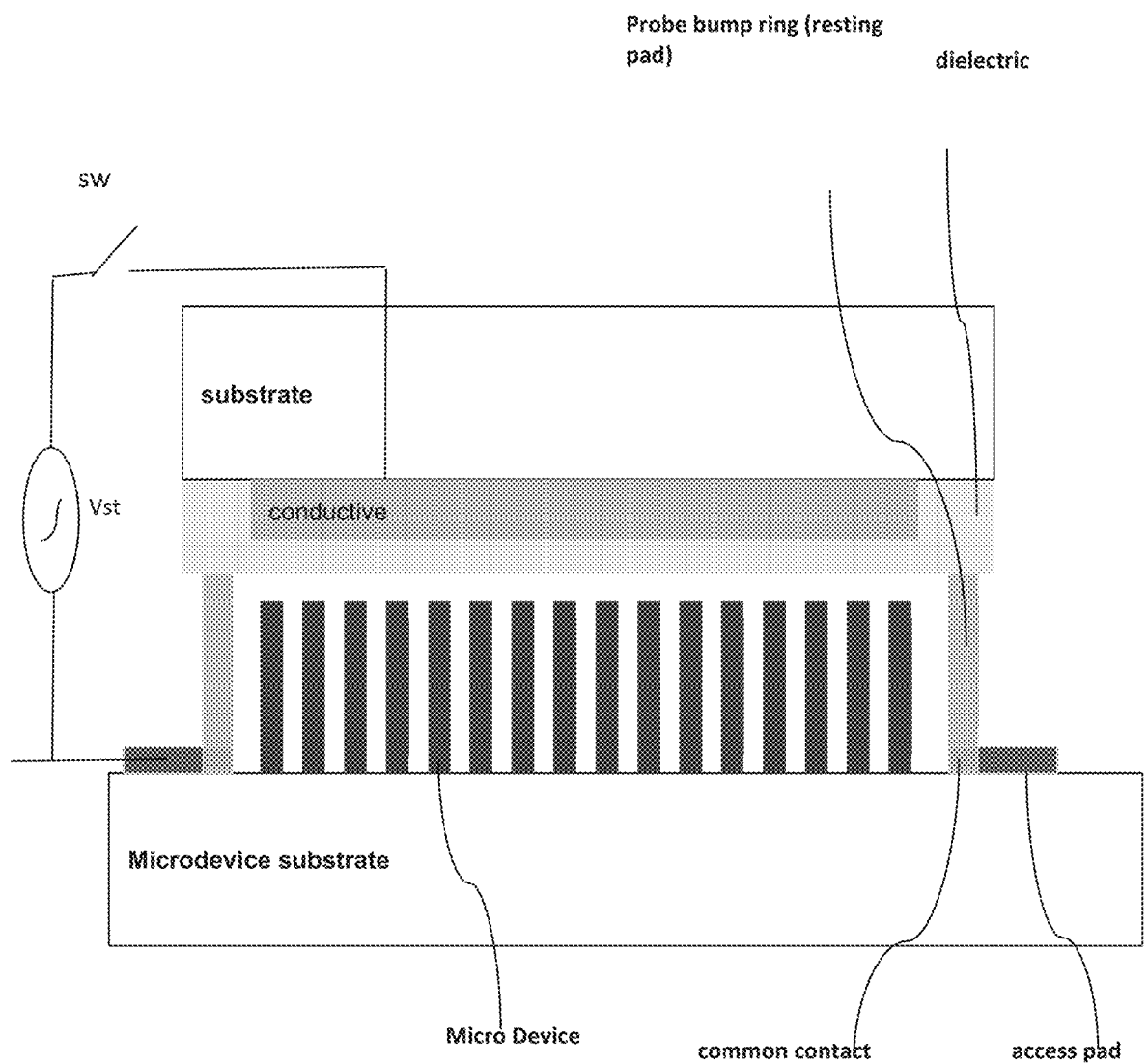
FIG. 1(a) shows an exemplary implementation of the probe and its position on the device during the measurement cycle.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

In this description, the terms "device" and "micro device" are used interchangeably. However, it is clear to one skilled in the art that the embodiments described here are independent of the device size.

Measuring micro devices across the wafer is needed to increase the yield of integrating functional micro devices into a system substrate. The challenge is the number of micro devices in an original (or donor) substrate that can be 100s of millions. Moreover, the devices are very small making contact measurement very difficult. One solution is to do post processing and using metal traces on the micro devices to create larger pads and form an array for measuring micro devices. While this method can work, the post processing steps add to the cost and defects.

In a first embodiment, a capacitive coupling through a common electrode (the electrode is made of a conductive layer covered by dielectric) can be used to stimulate a set (or one) of micro devices. The dielectric can be a thin film or an air gap or combination of both.

Here, a time varying signal (stimulating signal) $V_{ST}$ is applied to the capacitor that forms between at least one contact/pad of the micro device and the electrode. Depending on the position of the capacitor in respect to the current path through the device, one of the positive or negative slopes of the stimulating signal can activate a function in the micro device. In this case, that slope is called the active portion of the signal. The other portion of the signal is called the reset portion. Depending on the function under test, the active or reset portion of signal may change.

In some cases, the reset function may push the device into a state that cannot recover and get activated. For example, if the device is an LED with a parasitic capacitor, the positive slope of the signal will inject current to the diode and the voltage across the diode will settle to a $V_{ON}$ (which is the function of the injected current). After applying the negative slope, the voltage across the diode will shift to a very low value and the next positive slope will not be able to raise it to $V_{ON}$.

In addition to the first embodiment, to address the issue, where the reset function may push the device into a state that cannot recover and get activated, a switch is used in series to the stimulating signal $V_{ST}$. During the active portion of the signal, it is connected to the stimulating capacitor $C_{ST}$, and during the rest function (or portion of it), the signal is disconnected from the capacitor. This way, the biasing status of the device is controlled where in one case biasing status is the voltage level at one or more contacts/pads of the device. In another case, it can be the charge stored in the device capacitor or the stimulating capacitor.

In addition to the first embodiment, the stimulating capacitor value changes during the reset or active portion of the signal. This way, the impact of each reset or active portion is controlled to make sure the device is always set in good biasing condition.

The present invention is related to the function of a probe for microdevices. FIG. 1(a) shows an exemplary implementation of the probe and its position on the device during the measurement cycle. In one embodiment as given in FIG. 1(a) and FIG. 3, $V_{ST}$ is a stimulating signal, $C_d$ is a device capacitor and $C_{ST}$ is the stimulating capacitor. $C_{ST}$ is formed by the conductive layer, dielectric and device pad (access pad)/contact. There can be a pad (or probe bump ring)

around the probe to accommodate the probe resting on top of the microdevices. The probe bump ring/pad can be also conductive to couple with some contacts of microdevice(s). The resting pad can be a ring or other structure around the probe or other location of the probe.

Figure 1B:
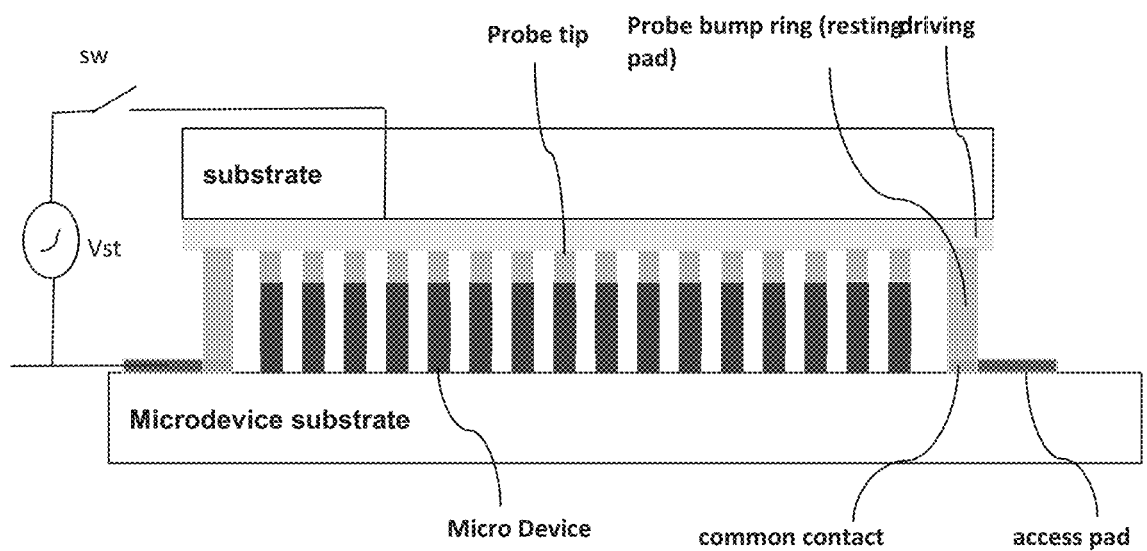
FIG. 1(b) shows another configuration There a probe tip is used instead of the coupling probe electrode.
Figure 2:
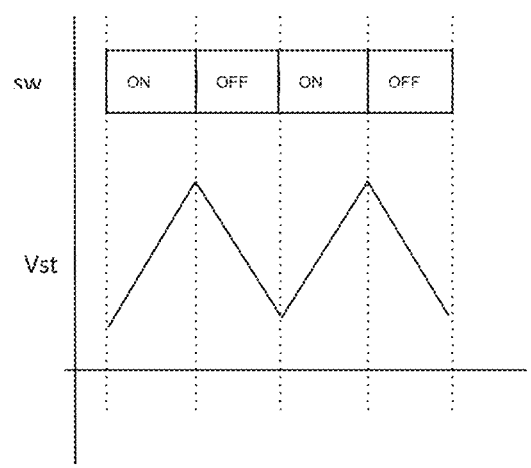
Figure 3:
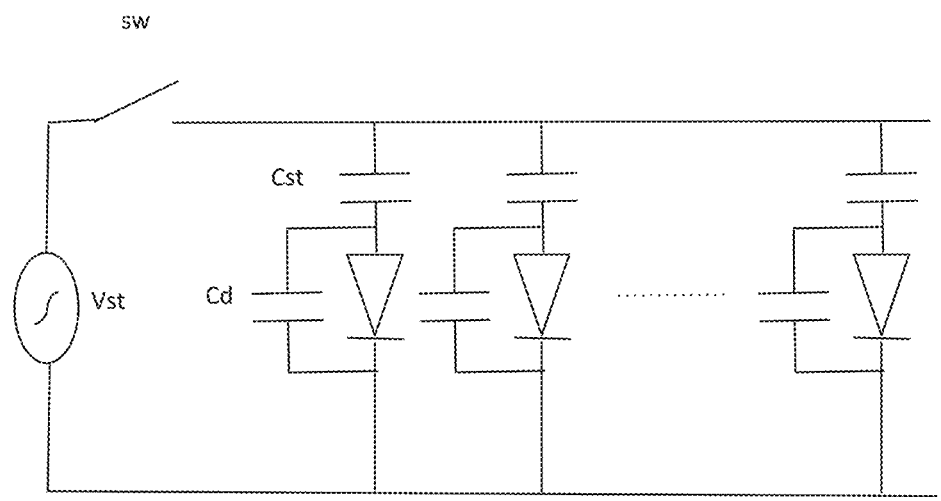
FIG. 3 shows the electrical structure of the probe.

The switch SW, as shown in FIG. 1a, FIG. 1B and FIG. 3, is needed to make sure the microdevices can be turned ON after the first active portion of the signal as shown in FIG. 2. The active slope of $V_{ST}$, as shown in FIG. 2, is when the device turns ON, the reset slope is during which the device is not ON. Here, the active slope of the signal is positive.

FIG. 1(b) shows another configuration where a probe tip is used instead of the coupling probe electrode. Here the resting pads protect the probe tips and microdevices from unwanted pressure.

The resting pads can also be active structures. Here, a sensor can be used to identify the position of the probe in reference to the surface or microdevices. The sensor can be capacitive, inductive, or waveform based.

The probe structure of FIG. 1(b) can be mounted in a leveling apparatus. When the probe is brought close to the microdevices, one part of the resting pads can touch the microdevice substrate if the probe is not leveled with the microdevice substrate. Here the leveling apparatus can adjust the position of the probe to make it level with the substrate. The levelling apparatus can be passive such as gimbal or it can be active using actuators. The resting pads can retract after leveling to enable the probe (either probe tip or coupling electrode) to get in contact or close proximity of the microdevices. In one case, the resting pads can be made of soft material that retract under pressure. In another related case, the resting pads are active and use either actuator (piezoelectric or other form) of electroactive polymers to retract. It can retract fully or partially.

In addition to the first embodiment, to address the issue, where the reset function may push the microdevice into a state that cannot recover and get activated, a switch is used in series to the stimulating signal $V_{ST}$. Here the active signal can be a negative slope of the $V_{ST}$.

If the switch SW is not there, when the $V_{ST}$ has a reset (negative in here) slope, it will push the device into a biasing condition that will make it impossible to turn it on with the same active part of the signal (positive slope here).

In addition to the first embodiment, to address the issue, where the reset function may push the device into a state that cannot recover and get activated, a switch is used in series to the stimulating signal $V_{ST}$. Here another approach is to increase the slope or the amplitude of the active part of $V_{ST}$ after each cycle. As can be seen, this will limit how many times the device can turn ON.

In addition to the first embodiment, to address the issue, where the reset function may push the device into a state that cannot recover and get activated, a switch is used in series to the stimulating signal $V_{ST}$. The switch disconnects the $V_{ST}$ from the devices during the reset slope of the signal. As a result, the device state will not change and so it can turn ON during the active part of the signal without limitation of cycle numbers.

In addition to the first embodiment, to address the issue, where the reset function may push the device into a state that cannot recover and get activated, a switch is used in series to the stimulating signal $V_{ST}$. During the active portion of the signal, it is connected to the stimulating capacitor $V_{ST}$, the $V_{ST}$ can be a variable capacitor and so the impact of the capacitor coupling on the device is reduced during the reset slope of the signal. Thus, the biasing status of the micro device does not change significantly.

Method Embodiments

The present invention also describes a method to measure cycles of a microdevice using a coupling probe, by applying a time varying stimulating voltage signal to a stimulating capacitor that is formed between at least one contact or pad of the microdevice and a common electrode, activating a function in the microdevice due to one of a positive or a negative slope of the stimulating voltage signal and using a switch to keep the micro device turned ON after an active portion of the time varying stimulating voltage signal.

The present invention further describes a method to measure cycles of a microdevice using a coupling probe, by applying the time varying stimulating voltage signal to the stimulating capacitor that is formed between at least one contact/pad of the micro device and a common electrode, activating a function in the microdevice due to one of the positive or the negative slope of the stimulating voltage signal and increasing an amplitude of the active part of time varying stimulating voltage signal after each cycle.

The probe switch disconnects the microdevice during the reset slope of the time varying stimulating voltage signal wherein a stimulating capacitor value changes during the reset slope or active portion of the time varying stimulating voltage signal to control the impact of each reset slope or an active portion to keep the microdevice in a good biasing condition.

In one embodiment the probe electrode is a common electrode with the microdevice, wherein the active portion of the signal the microdevice is connected to the stimulating capacitor, and during the rest slope, the time varying stimulating voltage signal is disconnected from the stimulating capacitor such that a biasing status of the microdevice is controlled wherein one case the biasing status is a voltage level at one or more contacts or pads of the device.

In another embodiment the probe electrode is a common electrode where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is a charge stored in the stimulating capacitor.

In another embodiment the probe electrode is a common electrode where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is the charge stored in a device capacitor.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

The invention claimed is:

1. A coupling probe to measure cycles of a microdevice comprising:
   an electrode made of a conductive layer covered by a dielectric to stimulate the microdevice;
   a stimulating capacitor formed by the conductive layer, the dielectric and a microdevice pad;

a voltage stimulating source to stimulate the stimulating capacitor; and a switch in series to control a biasing condition of the microdevice to turn the microdevice ON after a first active portion of a stimulating signal, wherein a stimulating capacitor value which changes during a reset slope or an active portion of the time varying stimulating voltage signal to control the impact of each reset slope or active portion to keep the microdevice in a good biasing condition.

2. The probe of claim 1, wherein the dielectric is a thin film or an air gap or combination of both.

3. The probe of claim 1, wherein the electrode is a common electrode with the microdevice.

4. The probe of claim 1, wherein the switch is a point of disconnection for the voltage stimulating source from the microdevice during a portion of a reset slope of the stimulating signal.

5. The probe of claim 1, wherein the stimulating capacitor is a variable capacitor to minimize an impact of a capacitor coupling on the microdevice is reduced during a reset slope of the time varying stimulating voltage signal.

6. The probe of claim 1, where in the switch disconnects the microdevice during the reset slope of the time varying stimulating voltage signal.

7. The probe of claim 6, wherein the active portion of the signal the microdevice is connected to the stimulating capacitor, and during the rest slope, the time varying stimulating voltage signal is disconnected from the stimulating capacitor such that a biasing status of the microdevice is controlled wherein one case the biasing status is a voltage level at one or more contacts or pads of the device.

8. The probe of claim 6, where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is a charge stored in the stimulating capacitor.

9. The probe of claim 6, where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is the charge stored in a device capacitor.

10. The probe of claim 1, wherein the probe is resting on top of the microdevice on resting pads.

11. The probe of claim 10, wherein the resting pads are conductive to couple with one or more contacts of microdevice.

12. The probe of claim 10, wherein the resting pads are a ring or an alternate structure around the probe or any other location of the probe.

13. The probe of claim 10, wherein a probe structure of is mounted in a leveling apparatus and one part of the resting pads touches the microdevice substrate if the probe is not leveled with the microdevice substrate.

14. The probe of claim 13, wherein the leveling apparatus adjusts a position of the probe to make it leveled with the microdevice substrate and the resting pads retract after leveling to enable a probe tip or the coupling electrode to get in contact or close proximity of the microdevice.

15. The probe of claim 13, wherein the resting pads retract fully or partially.

16. The probe of claim 13, wherein the levelling apparatus is passive such as a gimbal or active using actuators.

17. The probe of claim 10, wherein the resting pads are active and use an actuator of electroactive polymers.

18. The probe of claim 17, wherein the active pad retracts during measurement to provide enhance the connection to the microdevice.

19. A method to measure cycles of a microdevice using a coupling probe, the method comprising:

applying a time varying stimulating voltage signal to a stimulating capacitor that is formed between at least one contact or pad of the microdevice and a common electrode;

activating a function in the microdevice due to one of a positive or a negative slope of the stimulating voltage signal; and using a switch to keep the microdevice turned ON after an active portion of the time varying stimulating voltage signal.

20. The probe of claim 19, wherein the switch is a point of disconnection for the voltage stimulating source from the microdevice during a portion of a reset slope of the stimulating signal.

21. The probe of claim 19, wherein the stimulating capacitor is a variable capacitor to minimize an impact of a capacitor coupling on the microdevice is reduced during a reset slope of the time varying stimulating voltage signal.

22. The probe of claim 19, wherein the switch disconnects the microdevice during a reset slope of the time varying stimulating voltage signal.

23. The probe of claim 19, wherein a stimulating capacitor value changes during the reset slope or active portion of the time varying stimulating voltage signal to control the impact of each reset slope or an active portion to keep the microdevice in a good biasing condition.

24. The probe of claim 22, wherein the active portion of the signal the microdevice is connected to the stimulating capacitor, and during the rest slope, the time varying stimulating voltage signal is disconnected from the stimulating capacitor such that a biasing status of the microdevice is controlled wherein one case the biasing status is a voltage level at one or more contacts or pads of the device.

25. The probe of claim 22, where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is a charge stored in the stimulating capacitor.

26. The probe of claim 22, where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is the charge stored in a device capacitor.

27. A method to measure cycles of a microdevice using a coupling probe, the method comprising:

applying the time varying stimulating voltage signal to a stimulating capacitor that is formed between at least one contact/pad of the microdevice and a common electrode;

activating a function in the microdevice due to one of the positive or the negative slope of the stimulating voltage signal; and increasing an amplitude of the active part of time varying stimulating voltage signal after each cycle.

28. The probe of claim 27, wherein the switch is a point of disconnection for the voltage stimulating source from the microdevice during a portion of a reset slope of the stimulating signal.

29. The probe of claim 27, wherein the stimulating capacitor is a variable capacitor to minimize an impact of a capacitor coupling on the microdevice is reduced during a reset slope of the time varying stimulating voltage signal.

30. The probe of claim 27, wherein the switch disconnects the microdevice during a reset slope of the time varying stimulating voltage signal.

31. The probe of claim 27, wherein a stimulating capacitor value changes during the reset slope or active portion of the time varying stimulating voltage signal to control the impact of each reset slope or an active portion to keep the microdevice in a good biasing condition.

32. The probe of claim 30, wherein the active portion of the signal the microdevice is connected to the stimulating capacitor, and during the rest slope, the time varying stimulating voltage signal is disconnected from the stimulating capacitor such that a biasing status of the microdevice is controlled wherein one case the biasing status is a voltage level at one or more contacts or pads of the device.

33. The probe of claim 30, where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is a charge stored in the stimulating capacitor.

34. The probe of claim 30, where in the active portion of the signal the microdevice is connected to the stimulating capacitor, and during the rest slope, the time varying stimulating voltage signal is disconnected from the stimulating capacitor such that the biasing status of the microdevice is controlled where in one case the biasing status is the charge stored in a device capacitor.

* * * * *